(12) United States Patent
Chikaishi et al.

(10) Patent No.: US 11,377,731 B2
(45) Date of Patent: Jul. 5, 2022

(54) FILM-FORMING DEVICE

(71) Applicant: Murata Manufacturing Co., Ltd., Nagaokakyo (JP)

(72) Inventors: Yasuhiro Chikaishi, Nagaokakyo (JP); Shigeki Yamane, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 18 days.

(21) Appl. No.: 16/901,600

(22) Filed: Jun. 15, 2020

(65) Prior Publication Data

US 2020/0308701 A1 Oct. 1, 2020

Related U.S. Application Data

(63) Continuation of application No. PCT/JP2018/044925, filed on Dec. 6, 2018.

(30) Foreign Application Priority Data

Dec. 22, 2017 (JP) .............................. JP2017-246513

(51) Int. Cl.
*C23C 16/44* (2006.01)
*C23C 16/455* (2006.01)
(Continued)

(52) U.S. Cl.
CPC ...... *C23C 16/4412* (2013.01); *C23C 16/4587* (2013.01); *C23C 16/45502* (2013.01);
(Continued)

(58) Field of Classification Search
CPC .......... C23C 16/45548; C23C 16/4412; C23C 16/45502; C23C 16/45534;
(Continued)

(56) References Cited

U.S. PATENT DOCUMENTS

| 9,117,862 B2 | 8/2015 | Ishizu et al. |
| 2008/0072821 A1 | 3/2008 | Dalton et al. |

(Continued)

FOREIGN PATENT DOCUMENTS

| JP | S59107071 A | 6/1984 |
| JP | S59217615 A | 12/1984 |

(Continued)

OTHER PUBLICATIONS

International Search Report issued for PCT/JP2018/044922, dated Feb. 26, 2019.

(Continued)

*Primary Examiner* — Jeffrie R Lund
(74) *Attorney, Agent, or Firm* — ArentFox Schiff LLP (57) ABSTRACT

A film-forming device that includes a cylindrical chamber capable of maintaining vacuum therein, a workpiece holder that is constructed to align and hold workpieces to be processed in multiple stages such that main surfaces of the workpieces are oriented in a vertical direction relative to a central axis of the chamber, a deposition material supply pipe, a modifier supply pipe, a carrier gas supply pipe, and an exhaust mechanism, wherein in a cross section of the chamber in a direction parallel to the main surfaces of the workpieces, the exhaust mechanism is located on a side opposite to an opening direction of gas outlets of the deposition, modifier, and carrier gas supply pipes, and a total gas flow from the deposition, modifier, and carrier gas supply pipes is symmetric about a centerline of the chamber.

12 Claims, 5 Drawing Sheets

Cross-sectional view taken along line A-A (51) Int. Cl.
*C23C 16/458* (2006.01)
*H01L 21/673* (2006.01)

(52) U.S. Cl.
CPC .. *C23C 16/45534* (2013.01); *C23C 16/45544* (2013.01); *C23C 16/45546* (2013.01); *C23C 16/45548* (2013.01); *C23C 16/45578* (2013.01); *C23C 16/45587* (2013.01); *H01L 21/67313* (2013.01)

(58) Field of Classification Search
CPC .......... C23C 16/45544; C23C 16/4587; C23C 16/45546; C23C 16/45587; C23C 16/45578; H01L 21/67109; H01L 21/67754; H01L 21/67313; H01L 21/31
See application file for complete search history.

(56) References Cited

U.S. PATENT DOCUMENTS

| | | | |
|---|---|---|---|
| 2009/0297710 A1 | 12/2009 | Lindfors | |
| 2011/0318489 A1 | 12/2011 | Ishizu et al. | |
| 2013/0137272 A1* | 5/2013 | Ishibashi | H01L 21/67109 438/706 |
| 2013/0149874 A1* | 6/2013 | Hirose | H01L 21/0217 438/763 |
| 2014/0179085 A1* | 6/2014 | Hirose | C23C 16/45544 438/478 |
| 2015/0087159 A1* | 3/2015 | Kuribayashi | C23C 16/45546 438/765 |
| 2016/0365264 A1 | 12/2016 | Tokunobu et al. | |
| 2017/0298508 A1* | 10/2017 | Yamakoshi | C23C 16/45574 |
| 2018/0286662 A1* | 10/2018 | Nagatomi | C23C 16/45563 |
| 2018/0374734 A1* | 12/2018 | Hirano | H01L 21/67109 |
| 2019/0267230 A1* | 8/2019 | Harada | H01L 21/0217 |
| 2020/0090930 A1* | 3/2020 | Hashimoto | C23C 16/45553 |
| 2020/0308700 A1* | 10/2020 | Chikaishi | H01L 21/31 |
| 2020/0308701 A1* | 10/2020 | Chikaishi | C23C 16/45546 |
| 2021/0098258 A1* | 4/2021 | Degai | C23C 16/45553 |

FOREIGN PATENT DOCUMENTS

| | | |
|---|---|---|
| JP | H01228123 A | 9/1989 |
| JP | H06151346 A | 5/1994 |
| JP | H07230962 A | 8/1995 |
| JP | H0936044 A | 2/1997 |
| JP | H09134913 A | 5/1997 |
| JP | H09148259 A | 6/1997 |
| JP | 2004048068 A | 2/2004 |
| JP | 2009529223 A | 8/2009 |
| JP | 2010186904 A | 8/2010 |
| JP | 2011523444 A | 8/2011 |
| JP | 5221089 B2 | 6/2013 |
| WO | 2015125733 A1 | 8/2015 |

OTHER PUBLICATIONS

Written Opinion of the International Searching Authority issued for PCT/JP2018/044922, dated Feb. 26, 2019.
International Search Report issued for PCT/JP2018/044925, dated Feb. 26, 2019.
Written Opinion of the International Searching Authority issued for PCT/JP2018/044925, dated Feb. 26, 2019.

* cited by examiner

Cross-sectional view taken along line A-A

FIG. 5

FILM-FORMING DEVICE

CROSS REFERENCE TO RELATED APPLICATIONS

The present application is a continuation of International application No. PCT/JP2018/044925, filed Dec. 6, 2018, which claims priority to Japanese Patent Application No. 2017-246513, filed Dec. 22, 2017, the entire contents of each of which are incorporated herein by reference.

FIELD OF THE INVENTION

The present invention relates to a film-forming device.

BACKGROUND OF THE INVENTION

Film-forming devices based on atomic layer deposition (ALD) are known as devices that form oxide films on substrates to be processed, such as semiconductor wafers.

Patent Literature 1 (JP 5221089 B) discloses a deposition method and a film-forming device based on atomic layer deposition.

SUMMARY OF THE INVENTION

In the film-forming device according to Patent Literature 1, a Zr source gas dispersion nozzle to supply a material gas into a processing container is arranged opposite to an exhaust port. In such a structure, the material gas easily flows toward the exhaust port, and the time the material gas is retained in the processing container is short. Due to the short retention time, the time the material gas is retained on workpieces (deposition targets) is also short, and the percentage of the material gas discharged without being deposited on workpiece surfaces is high.

This results in a large amount of wasted material gas and longer deposition time.

This also results in non-uniform deposition on the workpieces.

The present invention was made to solve the above problems, and aims to provide a film-forming device capable of uniformly depositing deposition material on workpieces in a short deposition time.

The film-forming device of the present invention is based on atomic layer deposition, and includes a chamber capable of maintaining a vacuum therein, a workpiece holder that is constructed to align and hold workpieces to be processed in multiple stages such that main surfaces of the workpieces are oriented in a vertical direction relative to a central axis of the chamber, a deposition material supply pipe positioned to supply a deposition material into the chamber, a modifier supply pipe positioned to supply a modifier into the chamber, a carrier gas supply pipe positioned to supply a first carrier gas into the chamber, and an exhaust mechanism that exhausts gas from the chamber, wherein in a cross section of the chamber in a direction parallel to the main surfaces of the workpieces, the exhaust mechanism is located on a side opposite to an opening direction of gas outlets of the deposition material supply pipe, the modifier supply pipe, and the carrier gas supply pipe, and a total gas flow from the deposition material supply pipe, the modifier supply pipe, and the carrier gas supply pipe is symmetric about a centerline of the chamber parallel to the vertical direction of the main surfaces of the workpieces.

In the film-forming device of the present invention, preferably, the deposition material supply pipe is constructed to supply a first mixed gas of the deposition material and a second carrier gas into the chamber; the modifier supply pipe is constructed to supply a second mixed gas of the modifier and a third carrier gas into the chamber; and the deposition material supply pipe, the modifier supply pipe, and the carrier gas supply pipe are configured to constantly supply the first, second, and third carrier gases, respectively, into the chamber.

In the film-forming device of the present invention, preferably, in the cross section of the chamber in the direction parallel to the main surfaces of the workpieces, the opening direction of the gas outlets of the deposition material supply pipe, the modifier supply pipe, and the carrier gas supply pipe is oriented in an upward direction, and the exhaust mechanism is located below the workpieces.

In the film-forming device of the present invention, preferably, an opening area of an air inlet of the exhaust mechanism is larger than an opening area of each gas outlet of the deposition material supply pipe, the modifier supply pipe, and the carrier gas supply pipe.

Preferably, the film-forming device of the present invention further includes a flow direction regulator that changes a direction of gas flow from the deposition material supply pipe, the modifier supply pipe, and the carrier gas supply pipe toward the exhaust mechanism.

The present invention provides a film-forming device capable of uniformly depositing on workpieces in a short deposition time.

DETAILED DESCRIPTION OF THE PREFERRED EMBODIMENTS

The film-forming device of the present invention is described below.

The present invention is not limited to the following preferred embodiments, and may be suitably modified without departing from the gist of the present invention. Combinations of two or more preferred features described in the following preferred features are also within the scope of the present invention.

The term "horizontally" as used herein does not necessarily refer to a strict horizontal direction. For example, the term includes a direction inclined by about ±10° relative to the horizontal direction. Similarly, the terms "vertically" and "vertical direction" as used herein do not necessarily refer to a strict vertical direction. For example, the term includes a direction inclined by about ±10° relative to the vertical direction.

Figure 1:
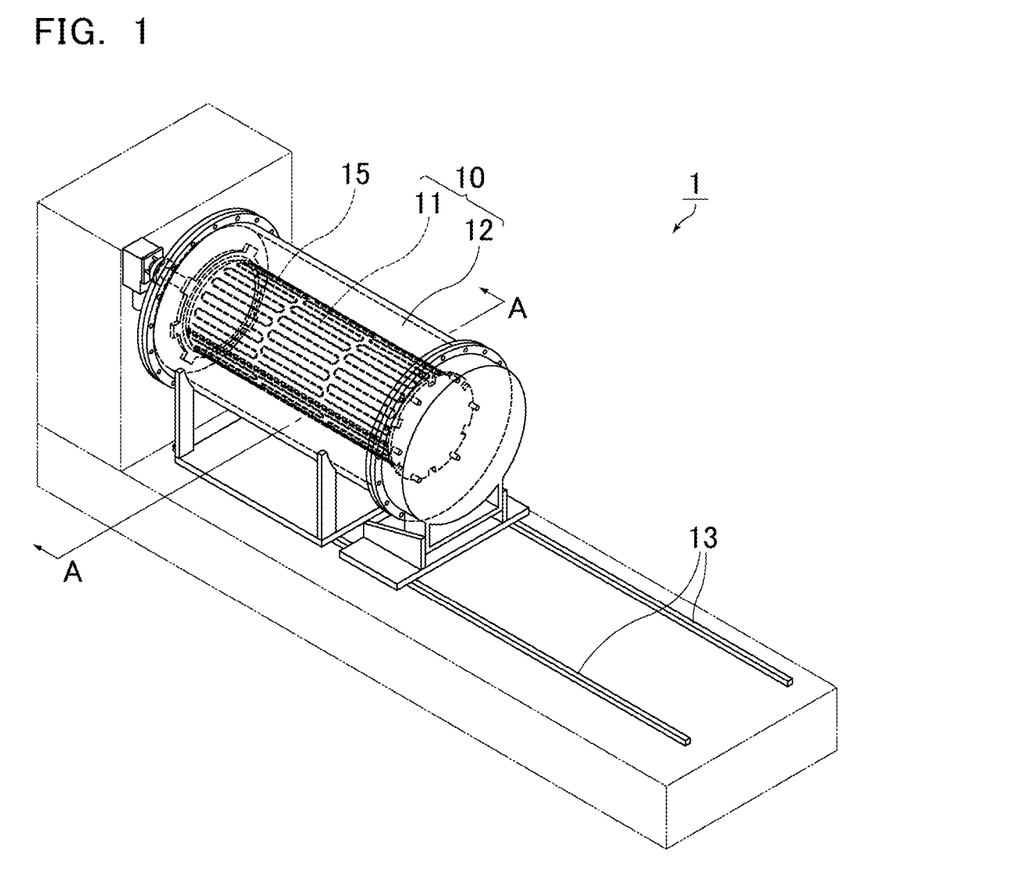
FIG. 1 is a schematic perspective view of a film-forming device according to an embodiment of the present invention.

FIG. 1 is a schematic perspective view of a film-forming device according to an embodiment of the present invention.

Figure 2:
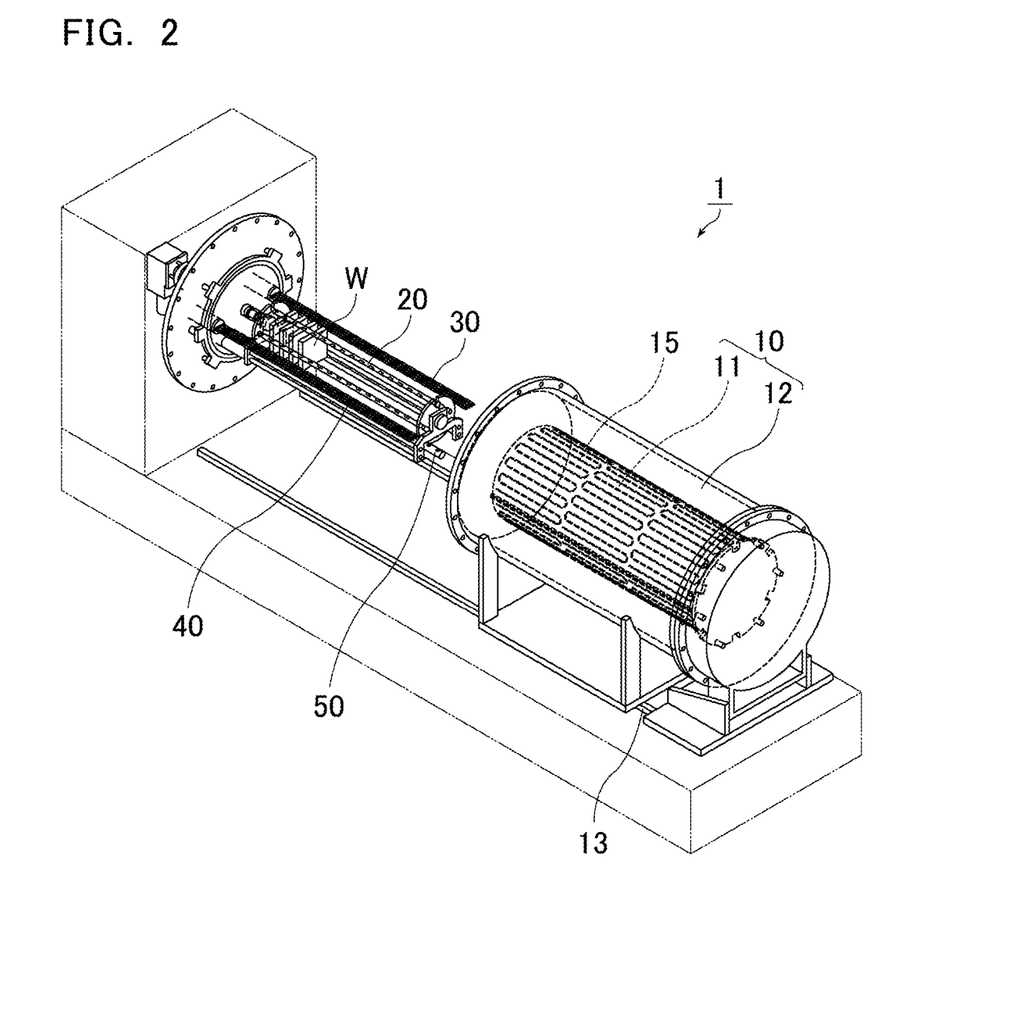
FIG. 2 is a schematic perspective view of a state in which a chamber is open in the film-forming device shown in FIG. 1.

FIG. 2 is a schematic perspective view of a state in which a chamber is open in the film-forming device shown in FIG. 1.

A film-forming device 1 shown in FIG. 1 and FIG. 2 includes a chamber 10 capable of maintaining a vacuum therein, a workpiece holder 20 that aligns and holds workpieces W to be processed in multiple stages in the chamber 10, and a heater 15 that heats the inside of the chamber 10.

In the film-forming device 1, the chamber 10 has its axis aligned horizontally and preferably has a cylindrical shape. As shown in FIG. 1, the chamber 10 includes an inner chamber 11 in which the workpiece holder 20 (see FIG. 2) is placed and an outer chamber 12 that houses the inner chamber 11.

While FIG. 1 and FIG. 2 each show a double-chamber structure including the inner chamber and the outer chamber, the film-forming device of the present invention may include only a single chamber.

The film-forming device 1 includes a guide 13. The chamber 10 is movable horizontally on the guide 13 by the driving of a motor (not shown). The driving is stopped after the chamber (or portions of the chamber) are moved to predetermined positions, whereby the chamber 10 is opened.

As described above, when the chamber has its axis aligned horizontally and is movable horizontally, it provides enough space so that the workpieces can be easily placed and removed in the chamber. Even when the number of workpieces is large, the size of the film-forming device can be reduced in the height direction. Thus, environments in which the film-forming device can be placed are less limited.

As shown in FIG. 2, the workpiece holder 20 is placed in the open chamber.

The workpiece holder 20 can align and hold workpieces W to be processed in multiple stages such that main surfaces of the workpieces W are oriented in a vertical direction relative to the axis of the chamber. In this case, these workpieces are arranged spaced apart from each other, with their main surfaces opposing each other.

When deposition is performed on workpieces arranged with their main surfaces oriented in the vertical direction, particles such as impurities are less likely to remain on the main surfaces of the workpieces. In addition, there is no risk of the workpieces falling from an upper portion of the chamber as compared to the case where the workpieces are stacked vertically. Thus, work can be performed safely.

FIG. 2 also shows a right-side gas supply pipe group 30 on the right side of the workpiece holder 20 and a left-side gas supply pipe group 40 on the left side of the workpiece holder 20.

FIG. 2 also shows an exhaust mechanism 50 on the lower side of the workpiece holder 20.

The right side, left side, and lower side of the workpiece holder are positions relative to the workpiece holder when the workpiece holder 20, the right-side gas supply pipe group 30, the left-side gas supply pipe group 40, and the exhaust mechanism 50 are viewed in a direction shown in FIG. 4 (described later).

The right-side gas supply pipe group 30, the left-side gas supply pipe group 40, and the exhaust mechanism 50 are described in detail later.

Figure 3:
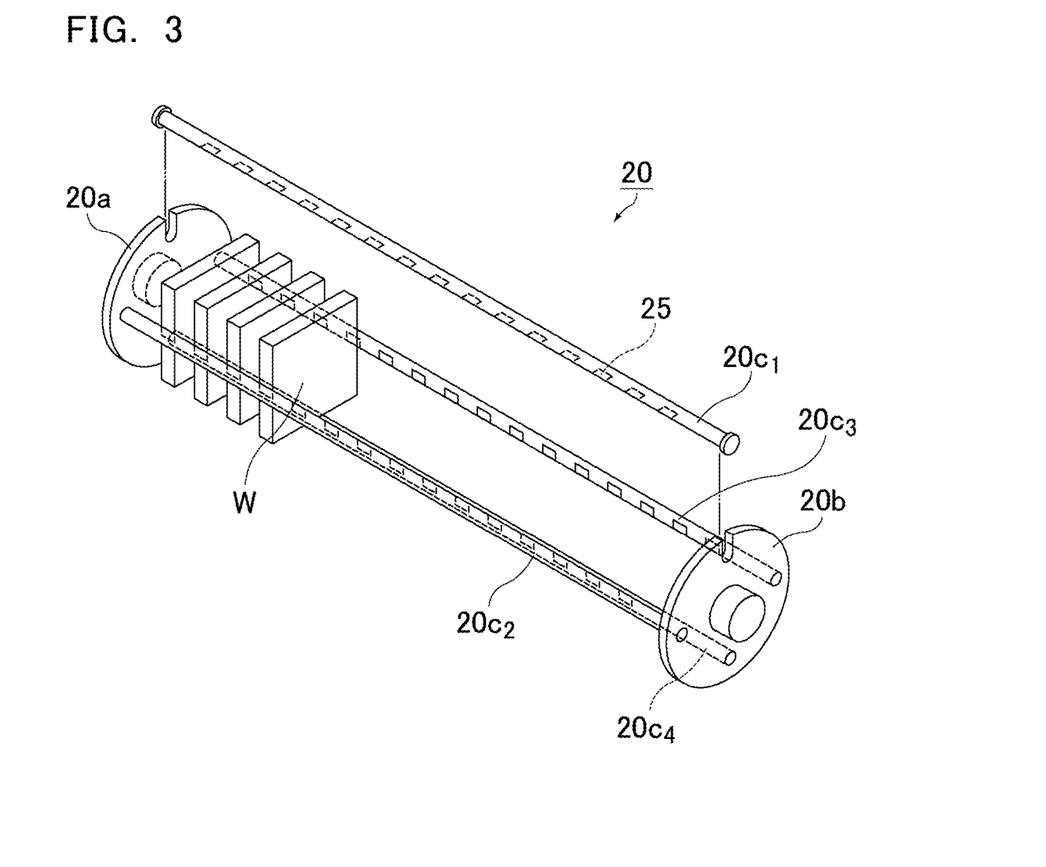
FIG. 3 is a schematic perspective view of an example of a workpiece holder holding workpieces.

FIG. 3 is a schematic perspective view of an example of a workpiece holder 20 holding workpieces W.

The workpiece holder 20 shown in FIG. 3 includes a pair of support plates 20a and 20b and multiple support posts $20c_1$, $20c_2$, $20c_3$, and $20c_4$ coupled to the support plates 20a and 20b. The support posts $20c_1$, $20c_2$, $20c_3$, and $20c_4$ each include multiple grooves 25 to hold the workpieces W. The workpieces W are held with their main surfaces oriented vertically. The support post $20c_1$ is removable.

The position of a heater is not limited as long as the heater can heat the inside of the chamber. Yet, preferably, the heater is attached to an outer wall of the inner chamber as shown in FIGS. 1 and 2, and more preferably, the heater is removably attached to the outer wall of the inner chamber.

The temperature in the inner chamber is stabilized by the heater attached to the outer wall of the inner chamber, which enables uniform deposition. In particular, when the heater is removable, it makes maintenance easy.

Figure 4:
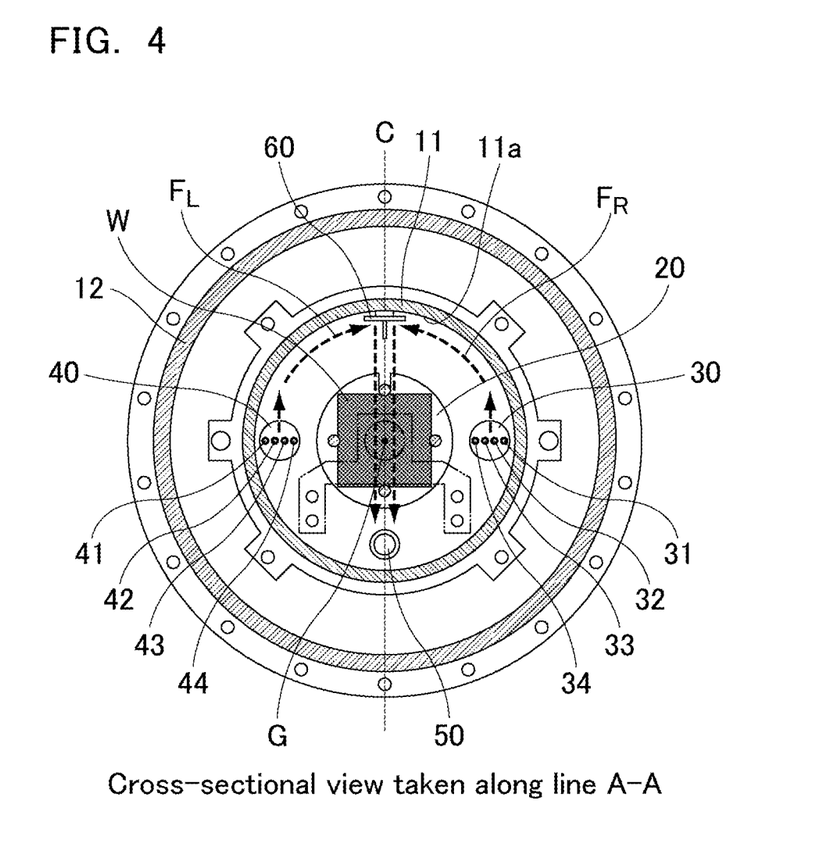
FIG. 4 is a cross-sectional view taken along line A-A of the film-forming device shown in FIG. 1.

FIG. 4 is a cross-sectional view taken along line A-A of the film-forming device shown in FIG. 1.

The following describes, with reference to FIG. 4, the arrangement of the gas supply pipes that supply gases into the chamber of the film-forming device and the arrangement of the exhaust mechanism that exhausts gas from the chamber.

Herein, the deposition material supply pipe, the modifier supply pipe, and the carrier gas supply pipe are referred to as "gas supply pipes" when these pipes are described without distinction.

FIG. 4 shows the workpiece holder 20 holding the workpiece W at the center of the chamber. The orientation of the main surface of the workpiece is the same as the orientation of the plane of the cross section of FIG. 4.

The right-side gas supply pipe group 30 is provided on the right side of the workpiece holder 20, and the left-side gas supply pipe group 40 is provided on the left side of the workpiece holder 20.

The right-side gas supply pipe group 30 includes four gas supply pipes, and the left-side gas supply pipe group 40 includes four gas supply pipes. Preferably, the number of gas supply pipes is the same between the right side and the left side of the workpiece holder.

Examples of the gas supply pipes included in the right-side gas supply pipe group 30 and the left-side gas supply pipe group 40 include the following three types: the deposition material supply pipe, the modifier supply pipe, and the carrier gas supply pipe.

There are no limitations as to how many of which types of pipes are included in the multiple gas supply pipes (eight in total in FIG. 4) of the right-side gas supply pipe group 30 and the left-side gas supply pipe group 40. Yet, preferably, the number of the carrier gas supply pipes is the largest.

In an example shown in FIG. 4, the four gas supply pipes included in the right-side gas supply pipe group 30 are a combination of a deposition material supply pipe 31, a carrier gas supply pipe 32, a carrier gas supply pipe 33, and a carrier gas supply pipe 34. The four gas supply pipes included in the left-side gas supply pipe group 40 are a combination of a modifier supply pipe 41, a carrier gas supply pipe 42, a carrier gas supply pipe 43, and a carrier gas supply pipe 44.

In deposition by atomic layer deposition, the deposition material supply pipe is a supply pipe that supplies a gas containing a deposition material that is a precursor of a compound to be deposited.

ALD can deposit metal oxides such as alumina ($Al_2O_3$) and silica ($SiO_2$); metal nitrides such as titanium nitride (TiN); and metals such as platinum (Pt).

Examples of the deposition material include trimethylaluminum (TMA: $Al(CH_3)_3$) to deposit alumina, trisdimethylaminosilane ($SiH[N(CH_3)_2]_3$) to deposit silica, titanium tetrachloride ($TiCl_4$) to deposit titanium nitride, and (trimethyl)methylcyclopentadienyl platinum ($MeCpPtMe_3$) to deposit platinum.

A carrier gas is also supplied with the deposition material through the deposition material supply pipe.

Preferably, a mixed gas of the deposition material and a carrier gas is prepared outside the film-forming device, and the mixed gas is supplied into the chamber through the deposition material supply pipe.

In deposition by atomic layer deposition, the modifier supply pipe is a supply pipe that supplies a gas as a modifier that modifies a precursor of a compound to be deposited in order to obtain a compound to be deposited.

Examples of the gas as a modifier include ozone, oxygen, water (steam), and ammonia.

In the case of alumina deposition, alumina can be deposited on workpieces by using TMA as a precursor and using ozone gas or water as a modifier.

In the case of silica deposition, silica can be deposited on workpieces by using trisdimethylaminosilane as a precursor and using ozone gas as a modifier.

In the case of titanium nitride deposition, titanium nitride can be deposited on workpieces by using titanium tetrachloride as a precursor and using ammonia gas as a modifier.

In the case of platinum deposition, platinum can be deposited on workpieces by using MeCpPtMe$_3$ as a precursor and using oxygen gas as a modifier.

A carrier gas is also supplied with the modifier through the modifier supply pipe.

Preferably, a mixed gas of the modifier and a carrier gas is prepared outside the film-forming device, and the mixed gas is supplied into the chamber through the modifier supply pipe.

In deposition by atomic layer deposition, each carrier gas supply pipe is a supply pipe that supplies a carrier gas as a purge gas after a deposition material is accumulated on the workpieces, and as a purge gas after a compound to be deposited is accumulated on the workpieces by a reaction of a modifier with the deposition material.

Examples of the carrier gas include inert gases such as nitrogen gas and argon gas.

Preferably, the same type of carrier gas as the carrier gas supplied through the carrier gas supply pipes is introduced into the deposition material supply pipe and the modifier supply pipe. Preferably, the carrier gas is constantly introduced through the three types of gas supply pipes.

Clogging of the gas supply pipes by the deposition material or the modifier can be prevented by constantly introducing the carrier gas through the three types of gas supply pipes.

An example of a deposition process based on atomic layer deposition is described with reference to a case where alumina is deposited on workpieces using TMA and ozone gas.

First, workpieces are set in the workpiece holder, and a vacuum is created in the chamber. The following steps (1) to (4) are repeated to deposit layers one by one.

(1) A deposition material (TMA) is supplied from the deposition material supply pipe to deposit one layer of TMA.

(2) The chamber is purged with a carrier gas to remove TMA from the chamber.

(3) A modifier (ozone gas) is supplied from the modifier supply pipe and reacted with TMA to deposit one layer of alumina.

(4) The chamber is purged with a carrier gas to remove all the ozone gas from the chamber.

The deposition material supply pipe, the modifier supply pipe, and the carrier gas supply pipes are arranged such that the total gas flow from the deposition material supply pipe, the modifier supply pipe, and the carrier gas supply pipes is symmetric about a centerline of the chamber parallel to a vertical direction of the main surfaces of the workpieces.

In FIG. 4, the centerline parallel to the vertical direction of the workpieces is a line (a dotted line C in FIG. 4) passing through the center of gravity G of the workpiece W and parallel to the vertical direction of the main surface of the workpiece. The vertical direction of the workpieces is naturally determined once the film-forming device is assembled for operation.

The total gas flow from the deposition material supply pipe, the modifier supply pipe, and the carrier gas supply pipes is determined by the size of each gas outlet in the gas supply pipes. As long as the same number of gas outlets having the same size are provided symmetrically about the centerline, the total gas flow is considered to be symmetric.

When the size of the gas outlet is different for each gas supply pipe, the total gas flow may be determined as follows: the gas flow from the gas outlet is determined for each gas supply pipe, and the obtained values are added for a region to the left and a region to the right of the centerline.

When all the gas outlets of the deposition material supply pipe, the modifier supply pipe, and the carrier gas supply pipes have the same size, the total gas flow is symmetric about the centerline, as long as the total number of the deposition material supply pipe, the modifier supply pipe, and the carrier gas supply pipes is the same between the regions to the left and the right of the centerline.

When the total gas flow is symmetric about the centerline, it results in uniform contact of the gases with the workpieces and thus uniform deposition of the deposition material on the workpieces.

The workpieces W are not components defining the film-forming device of the present invention. The "centerline parallel to the vertical direction of the main surfaces of the workpieces" as described herein can be determined based on the following concept, even when no workpieces are held in the film-forming device.

The workpiece holder is a component defining the film-forming device of the present invention. The shape of the workpiece holder determines the shape of workpieces to be held by the workpiece holder.

Based on the shape of the workpiece to be held by the workpiece holder, the center of gravity of the workpiece is determined, and the centerline passing through the center of gravity of the workpiece and parallel to the vertical direction of the main surface of the workpiece can be drawn.

Thus, even in a film-forming device not holding workpieces, it is possible to determine the centerline parallel to the vertical direction of the main surfaces of the workpieces.

In addition, the main surfaces of the workpieces can be determined similarly based on the shape of the workpiece holder and the shape of the workpiece intended to be held.

FIG. 4 shows an example in which the right-side gas supply pipe group 30 includes the deposition material supply pipe 31 and the left-side gas supply pipe group 40 includes the modifier supply pipe 41. Yet, a preferred configuration is one in which both the right-side gas supply pipe group and the left-side gas supply pipe group include the deposition material supply pipe and the modifier supply pipe, and the types and the number of gas supply pipes are the same between the right-side gas supply pipe group and the left-side gas supply pipe group, so that the gas flow becomes more symmetric.

In a specific example, the right-side gas supply pipe group and the left-side gas supply pipe group are both combinations of one deposition material supply pipe, one modifier supply pipe, and two carrier gas supply pipes.

The film-forming device includes an exhaust mechanism that exhausts gas from the chamber.

The exhaust mechanism is located on a side opposite to an opening direction of the gas outlets of the deposition material supply pipe, the modifier supply pipe, and the carrier gas supply pipes.

Figure 5:
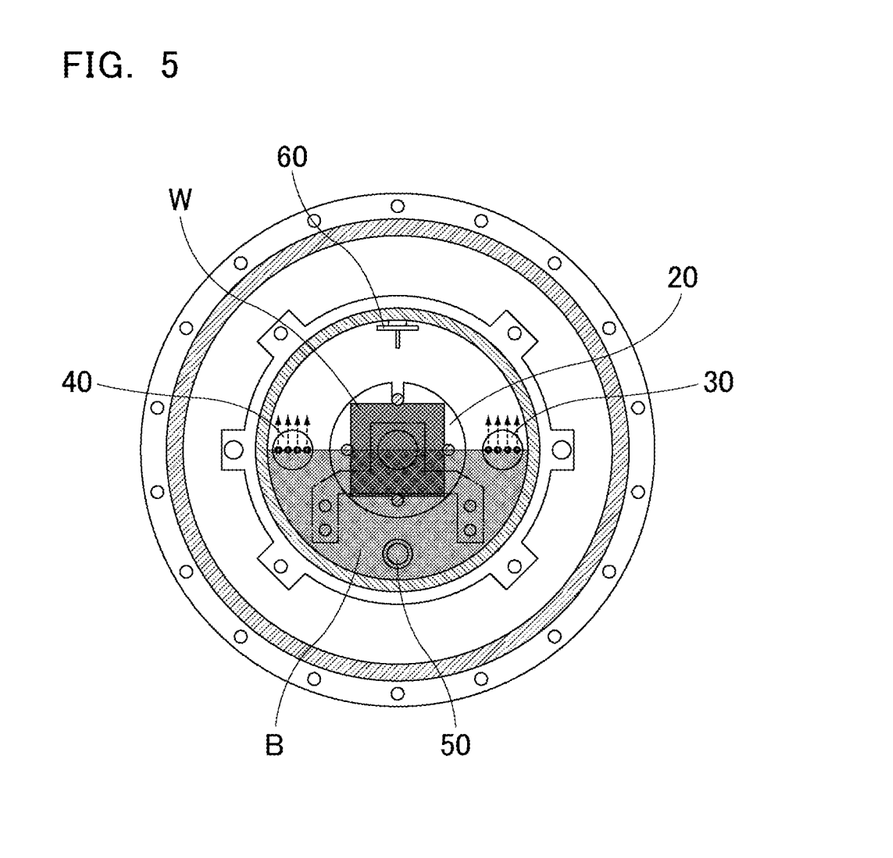
FIG. 5 is a schematic cross-sectional view of a positional relationship between an opening direction of gas outlets of gas supply pipes and an exhaust mechanism.

FIG. 5 is a schematic cross-sectional view of a positional relationship between the opening direction of the gas outlets of the gas supply pipes and the exhaust mechanism.

In FIG. 5, the opening direction of the gas outlets of the gas supply pipes included in the right-side gas supply pipe group 30 and the left-side gas supply pipe group 40 is oriented in an upward direction. FIG. 5 shows the direction of gas flow from the gas supply pipes included in the right-side gas supply pipe group 30 and the left-side gas supply pipe group 40.

In this case, the side opposite to the opening direction of the gas outlets is a hatched region B below the gas supply pipes in FIG. 5.

When the exhaust mechanism 50 is located within the region B, the exhaust mechanism is considered to be located on the side opposite to the opening direction of the gas outlets of the deposition material supply pipe, the modifier supply pipe, and the carrier gas supply pipes.

When the opening direction of the gas outlets is in the upward direction, preferably, the positional relationship between the exhaust mechanism and the workpiece holder is such that the exhaust mechanism is below the workpiece holder.

When the opening direction of the gas outlets is downward, preferably, the exhaust mechanism is above the workpiece holder.

With such an arrangement, the material gas (the deposition material and the modifier) that flowed from the gas outlets is retained on the workpieces held by the workpiece holder and then reaches the exhaust mechanism, so that the percentage of the material gas deposited on the workpiece surfaces is high. This results in a reduced amount of wasted material gas and shorter deposition time.

The exhaust mechanism is preferably a pipe including multiple air inlets. The exhaust mechanism is connected to an exhaust device such as a vacuum pump at an end (located outside of the chamber) of the pipe so that gases in the inner chamber can be exhausted.

When the exhaust mechanism is a pipe provided with multiple air inlets, preferably, the opening area of each air inlet is larger than the opening area of each gas outlet of the deposition material supply pipe, the modifier supply pipe, and the carrier gas supply pipes.

When the opening area of each air inlet is larger, clogging of the air inlets and the exhaust mechanism can be prevented even when the deposition material or the modifier is attached to the air inlets and the vicinity thereof.

The air inlets may face any direction, such as upward, sideways, or downward.

FIG. 4 schematically shows the direction of gas flow from the gas outlets of the gas supply pipes by dotted arrows (reference sings $F_R$ and $F_L$ in FIG. 4). The opening direction of the gas outlets of the gas supply pipes included in the right-side gas supply pipe group 30 and the left-side gas supply pipe group 40 shown in FIG. 4 is in the upward direction. Thus, the gases flow toward the upper portion of the chamber along the inner wall of the chamber (an inner wall 11a of the inner chamber 11 in FIG. 4).

Preferably, the gases that reach the upper portion of the chamber are retained on the workpieces and then flow into the exhaust mechanism. Thus, preferably, the direction of gas flow is changed such that the gases flow from the upper portion of the chamber toward the workpieces and the exhaust mechanism.

Thus, preferably, the film-forming device further includes a flow direction regulator that changes the direction of gas flow from the deposition material supply pipe, the modifier supply pipe, and the carrier gas supply pipes such that the gas flow is directed toward the exhaust mechanism.

FIG. 4 shows a flow direction regulator 60. FIG. 4 shows changes in the direction of gas flow that collided with the flow direction regulator 60. The flow direction regulator is a member having a T-shaped cross section, and can change the direction of gas flow such that the gases flow from the upper portion of the chamber toward a lower portion of the chamber.

The workpiece holder 20 is located below the flow direction regulator 60, and the workpiece holder 20 holds the workpieces W. The exhaust mechanism 50 is located below the workpiece holder 20. Thus, when the direction of gas flow is changed to downward by the flow direction regulator 60, the gases are retained on the workpieces W and then discharged from the exhaust mechanism 50.

Preferably, the inner wall 11a of the chamber is smooth. When the inner wall of the chamber is smooth, the deposition material is less likely to be attached to the inner wall of the chamber. The deposition material can be easily removed if attached to the inner wall of the chamber.

In the case of a double-chamber structure including the inner chamber and the outer chamber, the inner wall of the chamber refers to the inner wall of the inner chamber.

The film-forming device of the present invention is not limited to the above preferred embodiments. Various modifications and changes can be made to the structure and the like of the film-forming device without departing from the gist of the present invention.

When the film-forming device of the present invention has a double-chamber structure, preferably, the inner chamber and the outer chamber are separately movable horizontally. For example, the inner chamber and the outer chamber may move horizontally together, or only the inner chamber may move horizontally.

As described above, the structure of the film-forming device of the present invention is not limited to the double-chamber structure. The film-forming device may have a single chamber structure. The film-forming device may have a triple- or higher-order-chamber structure. In any case, preferably, the chambers are movable horizontally.

In the film-forming device of the present invention, more preferably, the chamber is not only movable horizontally but is also pivotable horizontally.

When the chamber is pivotable horizontally, the direction of the chamber can be changed to a position suitable for work, which makes maintenance easy.

REFERENCE SIGNS LIST 1 film-forming device
10 chamber
11 inner chamber
11a inner wall of inner chamber
12 outer chamber
13 guide
15 heater
20 workpiece holder 20a, 20b support plate
$20c_1$, $20c_2$, $20c_3$, $20c_4$ support post
25 groove
30 right-side gas supply pipe group
31 deposition material supply pipe
32, 33, 34, 42, 43, 44 carrier gas supply pipe
40 left-side gas supply pipe group
41 modifier supply pipe
50 exhaust mechanism
60 flow direction regulator
W workpiece
B region opposite to opening direction of gas outlets
C centerline parallel to vertical direction of workpieces
G center of gravity of workpiece
$F_R$, $F_L$ direction of gas flow

The invention claimed is:

1. A film-forming device comprising:
a chamber capable of maintaining vacuum therein;
a workpiece holder that is constructed to align and hold workpieces to be processed in multiple stages such that main surfaces of the workpieces are oriented in a vertical direction relative to a central axis of the chamber;
a deposition material supply pipe positioned to supply a deposition material into the chamber;
a modifier supply pipe positioned to supply a modifier into the chamber;
a carrier gas supply pipe positioned to supply a first carrier gas into the chamber; and
an exhaust mechanism that exhausts gas from the chamber,
wherein in a cross section of the chamber in a direction parallel to the main surfaces of the workpieces, the exhaust mechanism is located on a side of the deposition material supply pipe, the modifier supply pipe, and the carrier gas supply pipe that is opposite to an opening direction of gas outlets of the deposition material supply pipe, the modifier supply pipe, and the carrier gas supply pipe, and a total gas flow from the deposition material supply pipe, the modifier supply pipe, and the carrier gas supply pipe is symmetric about a centerline of the chamber parallel to the vertical direction of the main surfaces of the workpieces.

2. The film-forming device according to claim 1, wherein the deposition material supply pipe is constructed to supply a first mixed gas of the deposition material and a second carrier gas into the chamber,
the modifier supply pipe is constructed to supply a second mixed gas of the modifier and a third carrier gas into the chamber, and
the deposition material supply pipe, the modifier supply pipe, and the carrier gas supply pipe are configured to constantly supply the first, second, and third carrier gases, respectively, into the chamber.

3. The film-forming device according to claim 2, wherein the first, second, and third carrier gasses are a same type of carrier gas.

4. The film-forming device according to claim 1,
wherein in the cross section of the chamber in the direction parallel to the main surfaces of the workpieces,
the opening direction of the gas outlets of the deposition material supply pipe, the modifier supply pipe, and the carrier gas supply pipe is oriented in an upward direction, and
the exhaust mechanism is located below the workpieces.

5. The film-forming device according to claim 1, wherein an opening area of an air inlet of the exhaust mechanism is larger than an opening area of each gas outlet of the deposition material supply pipe, the modifier supply pipe, and the carrier gas supply pipe.

6. The film-forming device according to claim 1, further comprising a flow direction regulator that changes a direction of gas flow from the deposition material supply pipe, the modifier supply pipe, and the carrier gas supply pipe toward the exhaust mechanism.

7. The film-forming device according to claim 1, wherein the chamber is cylindrical.

8. The film-forming device according to claim 1,
wherein the deposition material supply pipe includes a first deposition material supply pipe positioned on a right side of the centerline of the chamber and a second deposition material supply pipe positioned on a left side of the centerline of the chamber,
the modifier supply pipe includes a first modifier supply pipe positioned on the right side of the centerline of the chamber and a second modifier supply pipe positioned on the left side of the centerline of the chamber, and
the carrier gas supply pipe includes a first carrier gas supply pipe positioned on the right side of the centerline of the chamber and a second carrier gas supply pipe positioned on the left side of the centerline of the chamber.

9. The film-forming device according to claim 8,
wherein the first and second deposition material supply pipes are constructed to supply a first mixed gas of the deposition material and a second carrier gas into the chamber,
the first and second modifier supply pipes are constructed to supply a second mixed gas of the modifier and a third carrier gas into the chamber, and
the first and second deposition material supply pipes, the first and second modifier supply pipes, and the first and second carrier gas supply pipes are configured to constantly supply the first, second, and third carrier gases, respectively, into the chamber.

10. The film-forming device according to claim 9, wherein the first, second, and third carrier gasses are a same type of carrier gas.

11. The film-forming device according to claim 1, wherein the deposition material supply pipe is positioned on a right side of the centerline of the chamber, and the modifier supply pipe is positioned on a left side of the centerline of the chamber.

12. A film-forming device comprising:
a chamber capable of maintaining vacuum therein;
a workpiece holder that is constructed to align and hold workpieces to be processed in multiple stages such that main surfaces of the workpieces are oriented in a vertical direction relative to a central axis of the chamber;
a deposition material supply pipe positioned to supply a deposition material into the chamber;
a modifier supply pipe positioned to supply a modifier into the chamber;
a carrier gas supply pipe positioned to supply a first carrier gas into the chamber; and
an exhaust pipe that exhausts gas from the chamber,
wherein in a cross section of the chamber in a direction parallel to the main surfaces of the workpieces, the exhaust pipe is located on a side of the deposition material supply pipe, the modifier supply pipe, and the carrier gas supply pipe that is opposite to an opening direction of gas outlets of the deposition material supply pipe, the modifier supply pipe, and the carrier gas supply pipe, and a total gas flow from the deposition material supply pipe, the modifier supply pipe, and the carrier gas supply pipe is symmetric about a centerline of the chamber parallel to the vertical direction of the main surfaces of the workpieces.

* * * * *